(12) United States Patent
Cadotte, Jr. et al.

(10) Patent No.: US 7,750,753 B1
(45) Date of Patent: Jul. 6, 2010

(54) PHOTONIC SEMICONDUCTOR ELECTROMAGNETIC LIMITER

(75) Inventors: Roland Cadotte, Jr., Freehold, NJ (US); William G. Trueheart, Jr., Sewell, NJ (US); Christopher W. Peters, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 173 days.

(21) Appl. No.: 12/174,990

(22) Filed: Jul. 17, 2008

Related U.S. Application Data (60) Provisional application No. 61/024,377, filed on Jan. 29, 2008.

(51) Int. Cl.
*H03G 11/00* (2006.01)
*H03H 7/38* (2006.01)

(52) U.S. Cl. .................................. 333/17.2; 333/81 A (58) Field of Classification Search .................. 333/33, 333/17.3, 17.2, 81 R, 81 A, 164, 161, 140, 333/12, 18
See application file for complete search history.

(56) References Cited

U.S. PATENT DOCUMENTS

| | | | |
|---|---|---|---|
| 4,675,624 A | * | 6/1987 | Rosen et al. ................. 333/161 |
| 5,159,295 A | * | 10/1992 | Reits .......................... 333/17.3 |
| 6,876,271 B2 | * | 4/2005 | Evers et al. ................. 333/81 A |

OTHER PUBLICATIONS

"The OP-AMP," published on-line at http://www.talkingelectronics.com/projects/OP-AMP/OP-AMP-2.html.

* cited by examiner

*Primary Examiner*—Stephen E Jones
(74) *Attorney, Agent, or Firm*—Duane Morris LLP (57) ABSTRACT

A system includes a source of electromagnetic energy or power and an amplitude-sensitive circuit. An amplitude-limiting transmission line couples the source to the circuit. The transmission line includes a semiconductor in the field of the transmission line and a light source for illuminating the semiconductor with light responsive to the amplitude from the source. Application of energy or power to the light source illuminates the semiconductor, which produces a plasma. The plasma tends to attenuate the energy or power reaching the circuit.

9 Claims, 7 Drawing Sheets

PHOTONIC SEMICONDUCTOR ELECTROMAGNETIC LIMITER

RELATED APPLICATION

This application claims the benefit of U.S. Provisional Application No. 61/024,377 filed on Jan. 29, 2008. The disclosure of U.S. Provisional Application No. 61/024,377 is incorporated herein by reference.

BACKGROUND OF THE INVENTION

Modern communication and remote sensing systems have become very sophisticated and effective. In the communications fields, equipment provides highly reliable, and in some cases secure, communications between or among widely separated locations, some or all of which may be in motion. One of the technological advancements which has allowed the excellent communications is the ubiquitous solid-state device, which has supplanted older technologies such as vacuum tubes. Among the major advantages of solid-state devices are small size, which allows complex functions to be incorporated into portable packages, and lack of any inherent degradation mechanisms. A salient disadvantage of such devices arises from the small size, and that disadvantage is the sensitivity of solid-state devices to application of small amounts of energy or power. It is well known that solid-state devices can be destroyed during those times in which they are being installed in a circuit by static discharges. Such static discharges can arise even from physical movements of the installer or his clothing, or from walking across a floor. Wrist straps are often provided to help to reduce static buildup when devices are being worked on.

Even when solid-state devices are properly installed in their circuits, they are still more vulnerable to certain types of damage than are vacuum tubes. More particularly, the input stages of certain equipments, such as low-noise amplifiers, are subject to damage similar to that occasioned by static discharge in the presence of strong electrical signals. Such strong electrical signals can occur even in sophisticated equipment. For example, unwanted signals can enter an antenna which happens to be in the presence of the unwanted signals. Even in "closed" systems such as a cable television system, unwanted signals, which may be of significant amplitude, may enter through imperfections in the joints between cable sections, or, in the case of a lightning strike, through the walls of the enclosure. In order to reduce the likelihood of damage to solid-state equipment subject to unwanted signals, the prior art uses bandwidth-reducing filters, such as bandpass filters, to tend to reject signals which are not in the frequency range(s) of interest. Alternatively or in addition, voltage limiters can be connected to the input port of sensitive equipment, to thereby tend to reduce the amplitude of unwanted signals of large amplitude.

The proliferation of communications and sensing devices which are difficult or impossible to service, such as microwave repeaters which are located on remote mountaintops, or communications links or sensors using Earth satellites, has increased the importance of protection of solid-state devices against unwanted electrical or electromagnetic surges. This is especially so when attacks against communication systems may include electromagnetic pulse generators such as nuclear blasts.

Improved or alternative protection is desired of electrically or electromagnetically sensitive equipment.

SUMMARY OF THE INVENTION

A transmission line according to an aspect of the invention is for coupling electromagnetic energy from an input port of the transmission line to an output port. The output port may be coupled to a receiver or other electrical (electromagnetic) amplitude-sensitive circuit. The transmission line comprises a light generator coupled to the input port and responsive to the electromagnetic energy for generating light. The transmission line also includes semiconductor material located within a region of the transmission line in which electric fields are generated by the flow of electromagnetic energy from the input port to the output port. The conductivity of the semiconductor material is responsive to the light from the light generator. In one embodiment of this aspect of the invention, the light generator comprises a diode or a laser. The diode may be a light-emitting diode or a rectifier device. In a particularly advantageous embodiment, the light generator includes a rectifier coupled to the input port of the transmission line for generating rectified electrical energy in response to applied electromagnetic signals, and an electrically-operated light source such as a laser diode or a light-emitting diode.

According to another aspect of the invention, an apparatus comprises an antenna for receiving electromagnetic energy or power, and a receiver for processing electromagnetic energy or power received by way of the antenna. The receiver is subject to degradation or damage in the presence of excessive amplitude of electromagnetic energy or power. A transmission line includes at least an elongated strip conductor overlying a conductive ground plane. The transmission line defines an "input" port coupled to the antenna and an "output" port coupled to the receiver, for communicating the electromagnetic energy or power from the antenna to the receiver. The transmission line includes a portion in which a semiconductor material lies between the strip conductor and the ground plane. A light generator is coupled to the input port for receiving electromagnetic energy from the antenna, and for producing light in response to the electromagnetic energy. The light impinges on the semiconductor, for thereby tending to render the portion of the semiconductor conductive in the presence of the excessive electromagnetic energy or power, and thereby tending to reflect a portion of the excessive electromagnetic energy or power. In one version, the light generator includes a rectifier coupled to the input port and a light generator coupled to the rectifier. In a further version, the rectifier is coupled to the input port by way of a path having an attenuation of no less than 3 dB.

A method according to another aspect of the invention is for coupling electromagnetic energy from a source of energy to a circuit which is subject to damage in the presence of excessive electromagnetic energy. The method comprises the steps of coupling the electromagnetic energy to the circuit by way of an electric-field guiding transmission line including a semiconductor material at least partially within the field or influence of the transmission line. The semiconductor material is illuminated with light, the amplitude of which is responsive to the amplitude of the electromagnetic energy.

DESCRIPTION OF THE INVENTION

Figure 1:
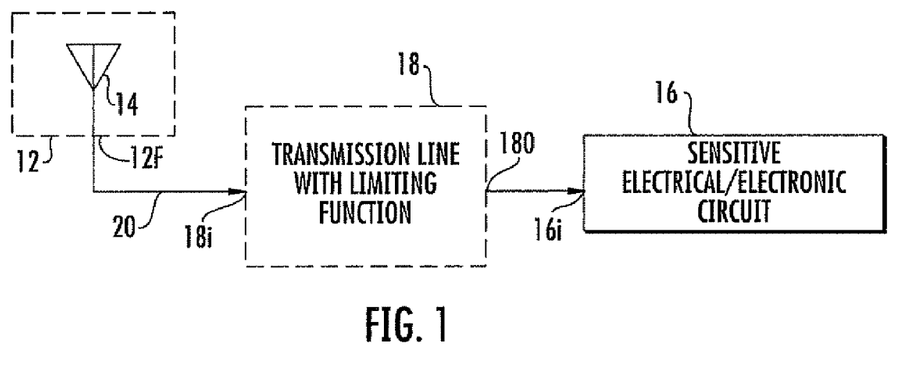
FIG. 1 is a simplified overall block diagram of a system according to an aspect of the invention, including a source of electromagnetic energy, a power- or energy-sensitive circuit for receiving electromagnetic energy, and a power-limiting transmission line extending from the source to the circuit.

In FIG. 1, a system 10 includes a source 12 of electromagnetic signal, which may be or include, as illustrated, an antenna 14.

Those skilled in the arts of antenna arrays know that antennas are transducers which transduce or convert electromagnetic energy between unguided- and guided-wave forms. More particularly, the unguided form of electromagnetic energy is that propagating in "free space," while guided electromagnetic energy follows a defined path established by a "transmission line" of some sort. Transmission lines include coaxial cables, rectangular and circular conductive waveguides, dielectric paths, and the like. Antennas are totally reciprocal devices, which have the same beam characteristics in both transmission and reception modes. For historic reasons, the guided-wave port of an antenna is termed a "feed" port, regardless of whether the antenna operates in transmission or reception. The beam characteristics of an antenna are established, in part, by the size of the radiating portions of the antenna relative to the wavelength. Small antennas make for broad or nondirective beams, and large antennas make for small, narrow or directive beams. It should be noted that, when more directivity (narrower beamwidth) is desired than can be achieved from a single antenna, several antennas may be grouped together into an "array" and fed together in a phase-controlled manner, to generate the beam characteristics of an antenna larger than that of any single antenna element. The structures which control the apportionment of power to (or from) the antenna elements of an array antenna are termed "beamformers," and a beamformer includes a beam port and a plurality of element ports. In a transmit mode, the signal to be transmitted is applied to the beam port and is distributed by the beamformer to the various element ports. In the receive mode, the unguided electromagnetic signals received by the antenna elements and coupled in guided form to the element ports are combined to produce a beam signal at the beam port of the beamformer. A salient advantage of sophisticated beamformers is that they may include a plurality of beam ports, each of which distributes the electromagnetic energy in such a fashion that different beams may be generated simultaneously. Thus, antenna 14 of FIG. 1 may be an antenna of any type, and its "feed" port is designated $12_F$.

The arrangement 10 of FIG. 1 further includes a block 16, which represents a circuit which is sensitive to excessive amounts of electromagnetic power or energy. It is well known that "low-noise" receivers or amplifiers are particularly sensitive to application of excessive energy, voltage or power, where "excessive" may be as little as a few millijoules, millivolts (mv), or milliwatts (mw). While application of watts of power to the base or gate of a low-noise semiconductor may actually render the semiconductor device inoperative, lesser amounts of power may heat the semiconductor material and result in changes in the characteristics of the semiconductor, which can degrade the operation of the device. Thus, it is very important, for reliable operation of a circuit operating on electromagnetic signals, that the amount of energy or power actually reaching the sensitive portions of a sensitive device such as 16 of FIG. 1 be limited.

Those skilled in the art know that power is the time rate of energy. In general, sensitivity of electronic devices is based on the time rate of application of energy, and not on the amount of instantaneous energy which may be applied. This is because of the heating effect of energy applied over a period of time. Even if the power is limited, application of substantial energy can result in electric fields of a magnitude that can damage a semiconductor device notwithstanding the lack of sufficient power to damage the device by heating. Because of the close relationship between power and energy, and because of the similarity of excessive amounts on a sensitive device, the terms are often used interchangeably, even though they are fundamentally different.

In the arrangement of FIG. 1, sensitive electrical or electronic device or circuit 16 defines an "input" port 16i to which it may be desired to apply electromagnetic energy received by antenna 14, or more generally produced by source 12. One of the undesirable characteristics of antennas is that they tend to be sensitive to unwanted signals which exist in their vicinity. Even though antennas may be "tuned" to tend to reject signals at frequencies other than the desired frequencies, the tuning of antennas often results in little rejection over broad frequency bands, with the result that the antenna may transduce unwanted signals. When the unwanted signals have large amplitude, the unwanted signals may be transduced with significant energy or power to the port 12F together with the desired signals.

It is well known to couple a source of electromagnetic signal, such as source 12, to a utilization apparatus, such as circuit 16, by way of a "transmission line." In many cases, a transmission line may be nothing but a conductive wire extending from the source of signal to the utilization apparatus. It has been found that such simple transmission lines tend to act like antennas, and thus may pick up undesired signals. Thus, a simple wire may conduct the electromagnetic energy, but lacks some of the other characteristics of a "transmission line." A somewhat stricter interpretation of "transmission line" defines it as having a constant surge or characteristic impedance. Such transmission lines include well-known structures such as two-wire-line, coaxial cable, microstrip, stripline, finline, and various types of hollow conductive "waveguides." In such transmission lines, the electric fields (and the associated magnetic fields) of the propagating electromagnetic energy are concentrated in certain cross-sectional regions. In two-wire-lines, the fields are chiefly found between and closely surrounding the two conductors (although in theory the fields extend infinitely far from the conductors). In microstrip and stripline transmission lines, the fields are chiefly found between the strip conductor and the associated ground plane(s). The fields in coaxial transmission lines and in hollow conductive waveguides are limited to regions between the inner and outer conductors in the case of coax, and within the enclosed region in hollow conductive waveguides. It should be noted that the hollow conductive waveguide may be viewed as a two-wire line supported by stubs having lengths which are a significant portion of a wavelength. The transmission line 18 of FIG. 1 may in principle be of any type.

It should be noted that the term "between" and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. The term "between" can also define the end points of the electrical field extending to points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

In FIG. 1, the transmission line 18 is coupled at an "input" end or port (as seen from the transmission line itself) 18$i$ to the "feed" port 12$_F$ of the source 12. This allows electromagnetic energy to be applied to the transmission line 18. The "load" applied to an "output" end or port (as seen from the transmission line) 18$i$ is the "input" port 16$i$ of the sensitive circuit 16. Those skilled in the art of transmission lines will recognize that in the absence of a "load" applied to the "output" port which "matches" the surge or characteristic impedance of the transmission line, it is possible for some (or possibly all) of the electromagnetic signal arriving at input port 18$i$ from source 12 to be reflected, either in whole or in part, from the "output" port 18$o$. It should be noted that, in FIG. 1, a line 20 with an arrowhead is illustrated as extending from source 12 port 12$_F$ to "input" port 18$i$, and a similar line 22 extends from "output" port 18$o$ to "input" port 16$i$ of sensitive circuit 16. Lines 10 and 22 are merely drawing conventions to illustrate or represent electrical coupling or connection, and do not represent actual physical structure. In ideal actual practice, the transmission line 18 extends directly from port 12$_F$ to port 16$i$.

The description herein includes relative placement or orientation words such as "top," "bottom," "up," "down," "lower," "upper," "horizontal," "vertical," "above," "below," as well as derivative terms such as "horizontally," "downwardly", "overlying," and the like. These and other terms should be understood as to refer to the orientation or position then being described, or illustrated in the drawing(s), and not to the orientation or position of the actual element(s) being described or illustrated. These terms are used for convenience in description and understanding, and do not require that the apparatus be constructed or operated in the described position or orientation. Terms concerning mechanical attachments, couplings, and the like, such as "connected," "attached," "mounted," refer to relationships in which structures are secured or attached to one another either directly or indirectly through intervening structures, as well as both movable and rigid attachments or relationships, unless expressly described otherwise.

Figure 2A:
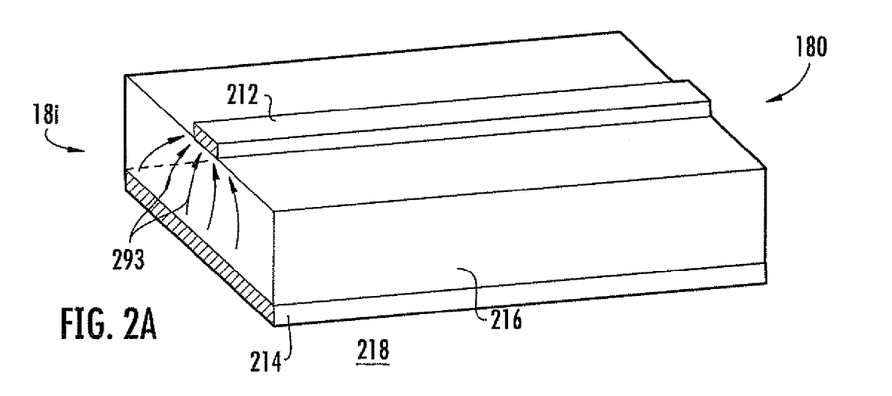
FIG. 2A is a simplified perspective or isometric view of a portion of a transmission line according to an aspect of the invention.

FIG. 2A is a notional perspective or isometric view of a portion 218 of transmission line 18 of FIG. 1. In FIG. 2A, portion 218 of transmission line is illustrated as being in the form of "microstrip" transmission line. The microstrip type of transmission line includes a strip conductor, illustrated as an elongated conductor 212, spaced apart from, but lying parallel to, and above, a conductive ground "plane" 214. The strip conductor 212 is supported "over" the ground plane 214 by means of a dielectric material designated 216. Those skilled in the art know that the surge or characteristic impedance of the transmission line depends, in part, on the characteristics of the dielectric material 216. Portion 218 of transmission line is illustrated as defining an electromagnetic port 18$i$, which can be viewed as corresponding to the "input" port of FIG. 1. Portion 218 of transmission line also defines a port which can be viewed as corresponding to "output" port 18$o$ of FIG. 1. To aid in understanding, some lines designated 293 are drawn on the dielectric material 216 at port 18$i$ to illustrate possible instantaneous electric fields within the dielectric material.

Figure 2B:
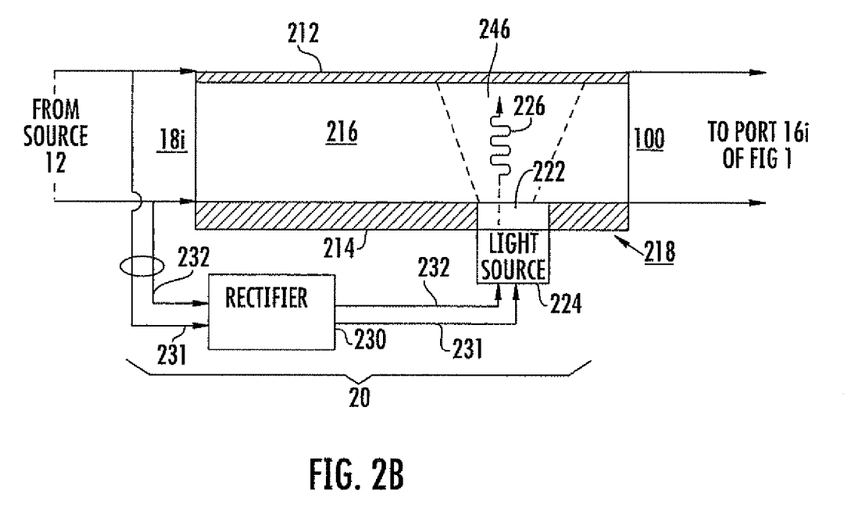
FIG. 2B is a simplified side elevation view of the transmission line of FIG. 2A, showing some details of one embodiment of the invention.

FIG. 2B is a side elevation cross-sectional view of the structure of FIG. 2A, with some additional elements according to an aspect of the invention. In FIG. 28, the ground plane 214 defines a light-passing portion 222, which may be an aperture, or possibly a transparent portion of the ground plane. A light source illustrated as a block 224 is located adjacent light-passing portion 222, and is oriented so that at least some of the light which it produces when energized is directed inwardly to the dielectric material 216, as suggested by the photon symbol 226. A rectifier arrangement illustrated as a block 230 is illustrated as being coupled (lines 231 and 232) to the junction of source 12 (not shown in FIG. 2B) and port 18$i$. Rectifier arrangement 230 rectifies a portion of the electromagnetic energy produced by source 12 which arrives at port 18$i$, and produces rectified electrical power for application to light source 224. The rectified electrical power may be in the form of pulsating direct voltage, which may be filtered to reduce the pulsations. The coupling 231, 232, the rectifier 230, and the light source 224 are designated together as being a light source responsive to electromagnetic energy or power 20.

In operation of the arrangement of FIG. 2B, the electromagnetic energy or power applied from source 12 propagates through transmission line 218 to the load, which in this case is port 16$i$ of circuit 16. A portion of the electromagnetic energy or power is converted to electrical energy by rectifier 230. In general, the greater the amplitude of the electromagnetic energy or power applied from source 12, the greater the amplitude of the electrical voltage produced by rectifier 230 for application to light source 224. Light source 224 therefore receives more electrical energization power when the electromagnetic energy from source 12 increases.

The light produced by source 224 and entering the semiconductor material 216 tends to generate free electrical carriers within the semiconductor material. When free electrical carriers exist within the semiconductor, the material begins to act as a conductor rather than as a dielectric material in the illuminated region. The illuminated region is illustrated as 246 in FIG. 2B. When fully illuminated, region 246 becomes sufficiently conductive to act as a short-circuit between the strip conductor 212 and the ground plane 214. Those skilled in transmission line arts know that a short-circuit within a transmission line will result in reflection of essentially all of the applied signal, thereby significantly attenuating the signals reaching the output port of the transmission line. Even when not fully illuminated, partial illumination will render the semiconductor material in region 246 partially conductive, which in effect connects a finite impedance between the strip conductor and ground. Such a finite impedance reduces the transmission-line impedance at the illuminated location below its surge or characteristic impedance, which has the effect of partially reflecting the incident signal. This action results is a feedback-like control of the attenuation or transmission of the transmission line, depending upon the magnitude of the applied electromagnetic energy or power. Application of more power to the input port of the transmission line of FIG. 2B results in more attenuation by the transmission line, and as a result an increase in the amount of energy or power is not fully felt at the amplitude-sensitive circuit.

Figure 2C:
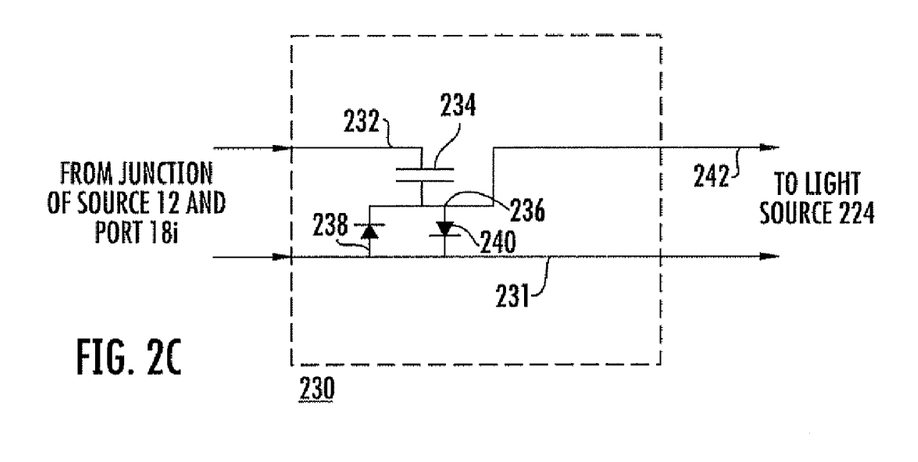
FIG. 2C is a schematic diagram illustrating details of a limiter/sensor according to an aspect of the invention.

FIG. 2C is a schematic representation of a possible circuit which could be used in the rectifier 230 of FIG. 2B. In FIG. 2C, the "ground" conductor is 231. A capacitor 234 connects the non-ground or "hot" conductor to a node 236. A pair of antiparallel-connected diodes or rectifier devices 238 and 240 are connected between ground 231 and node 236. When electromagnetic energy or power is applied from source 12 of FIG. 1, a portion of the power is full-wave rectified by diodes 238 and 240, and the resulting pulsating direct voltage or current tends to be averaged by capacitor 234, to produce at least a direct voltage component at node 236 relative to ground conductor 231. The voltage component is led to light source 224 by a conductor 242 for energizing the voltage source. Those skilled in the art know that such diodes or rectifiers have intrinsic offset voltages that must be overcome in the forward direction of conduction, and that the applied voltage must exceed the offset voltage before rectification can take place. In the context of rectification of applied energy or power for limiting purposes, the offset voltage is unlikely to be a problem. Instead, the problem is likely to be that the diodes or rectifiers perform their rectification when the applied electromagnetic energy is at less than its potential maximum value. This problem is solved by "decoupling" the rectifiers from the junction of the input port 18*i* and the source 12.

Figure 3:
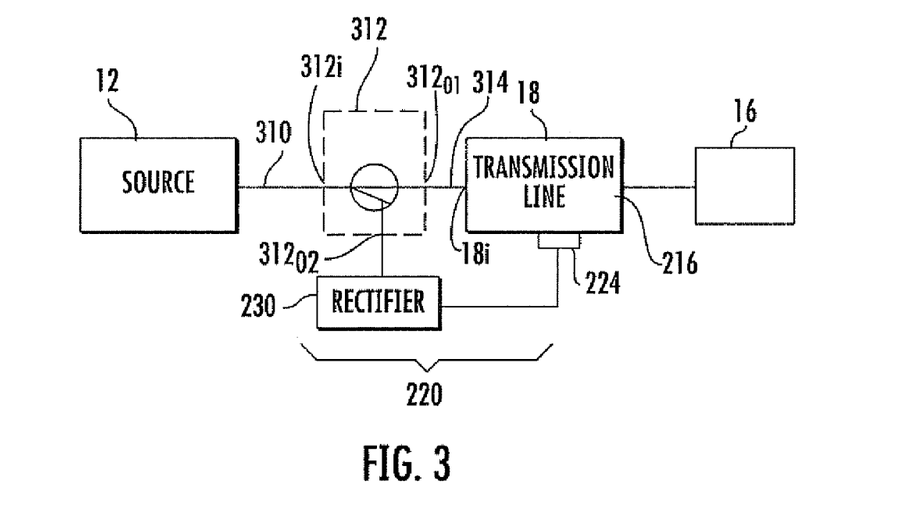
FIG. 3 is a schematic diagram illustrating the use of a signal level attenuator in the form of a directional coupler between the source of electromagnetic energy and a rectifier arrangement.

FIG. 3 is a simplified symbolic representation of a rectifying arrangement decoupled from the energy or power. In FIG. 3, source 12 delivers its energy or power to a transmission line 310, which is coupled to an input port 312*i* of a power dividing arrangement 312. A first output port 312*o*1 of power dividing arrangement 312 is coupled by way of a transmission line 314 to input port 18*i* of transmission line 18. A second output port 312*o*2 of power dividing arrangement 312 is coupled to rectifier arrangement 230. Rectifier arrangement 230 is connected to light source 224. Those skilled in the art will recognize that power dividing arrangement 312 can be as simple as a voltage-dividing resistor coupled in parallel with a main transmission path and in series with the secondary transmission path. This might be quite satisfactory for some power levels. Other power levels might be able to use other types of power dividers, such as the directional coupler symbolically represented within block 312. The effect of a power divider is to correspond or "match" the power or energy level applied to the input port of the transmission line 18 or 218 to the power or energy applied to the rectifier arrangement 230, so that the power level at the output port of transmission line 18 or 218 is held to the appropriate maximum value. In FIG. 3, a light source 220, which is responsive to incident electromagnetic amplitude, includes power divider 312, rectifier 230, and light source 224.

Figure 4:
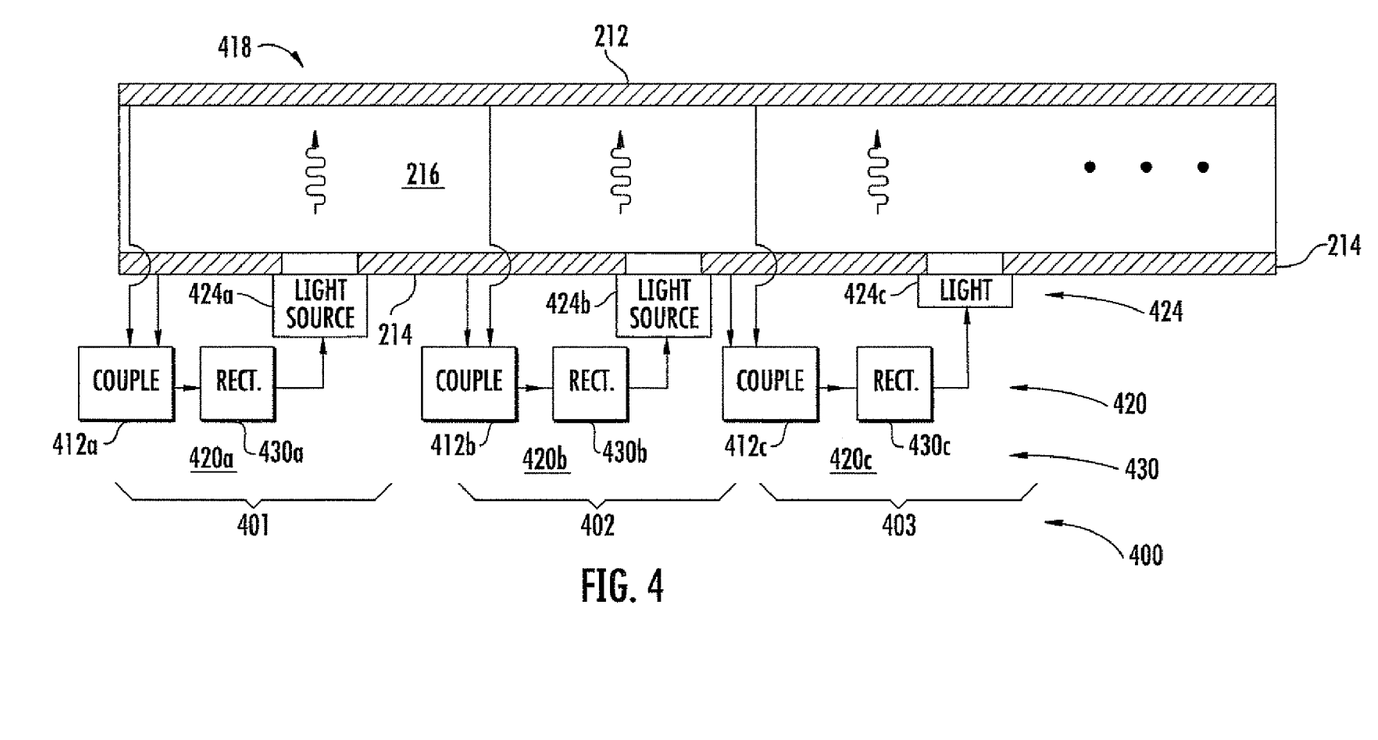
FIG. 4 is a simplified diagram illustrating a plurality of stages of attenuation of electromagnetic energy in a transmission line, with each stage including a coupling arrangement, a rectifier arrangement, a light source, and an associated portion of semiconductor material electromagnetically coupled to the transmission line.

FIG. 4 is a simplified illustration showing how several attenuation stages can be cascaded. In FIG. 4, a transmission line 218 includes a strip conductor 212, a ground conductor or plane 214, and semiconductor material 216 lying therebetween, at least at the locations of attenuator stages 401, 402, and 403 of a set 400 of attenuators. Each attenuator 401, 402, and 403 of set 400 of attenuators includes some of the semiconductor material 216, and also includes electromagnetically-responsive light sources 420*a*, 420*b*, and 420*c* of a set 420 of electromagnetically-responsive light sources. Electromagnetically-responsive light sources 420*a*, 420*b*, and 420*c* each include a coupler of a set 412 of couplers, a rectifier of a set 430 of rectifiers, and an electrically operated light source of a set 424 of light sources. More particularly, attenuator stage 401 includes an electromagnetically-responsive light source 420*a*, attenuator stage 402 includes an electromagnetically-responsive light source 420*b*, and attenuator stage 403 includes an electromagnetically-responsive light source 420*c*. Electromagnetically-responsive light source 420*a* includes electromagnetic energy or power coupler 412*a*, a rectifier arrangement 430*a*, and a light source 424*a*. Similarly, electromagnetically-responsive light source 420*b* of attenuator stage 402 includes electromagnetic energy or power coupler 412*b*, a rectifier arrangement 430*b*, and a light source 424*b*. For completeness, electromagnetically-responsive light source 420*c* of attenuator stage 403 includes electromagnetic energy or power coupler 412*c*, a rectifier arrangement 430*c*, and a light source 424*c*. The coupling blocks of set 412 may represent a coupling without attenuation such as that described in conjunction with FIG. 2B, or it may represent coupling with attenuation, as described in conjunction with FIG. 3. Each stage 401, 402, and 403 operates independently, depending only on the energy or power arriving at each stage. In operation, the first stage 401 of attenuation will provide attenuation to the initial power level, thereby reducing the energy or power level experienced at the downstream stages. If the energy or power applied to the first stage 401 of attenuation becomes so large that significant amounts of energy or power manage to pass stage 401, then stage 402 acts on that energy or power level to further attenuate the amount arriving at downstream stage 403. Any excessive energy or power which makes it past stage 402 is further limited by stage 403.

Figure 5A:
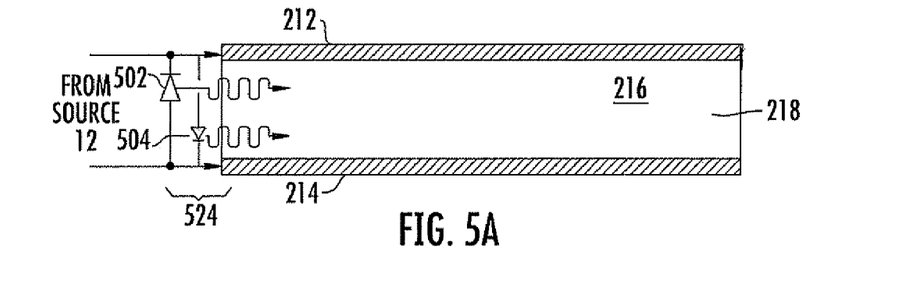
FIG. 5A is a simplified representation of an arrangement according to an aspect of the invention in which the light sources are galvanically coupled to directly receive the electromagnetic energy to be attenuated.

As so far described, the light produced has been powered by rectified energy or power produced by a separate rectifier in each stage of attenuation. It is also possible to directly energize a light source which illuminates the semiconductor material to produce the desired attenuation. FIG. 5A is a simplified notional representation of a stage of attenuation using a transmission line including a strip conductor 212, a ground conductor 214, and semiconductor material 216. As illustrated, a stage 524 of electromagnetically-responsive light source includes first and second antiparallel-connected light-emitting diodes 502 and 504, which are connected between the strip conductor 212 and the ground conductor 214. The light-emitting diodes 502 and 504 are located so that at least some of their light impinges on the semiconductor 216 in the region between the strip conductor and the ground conductor. This region is, of course, that in which the electric fields tend to be concentrated or most intense in the transmission line. The light-emitting diodes respond to the application of electromagnetic energy at a sufficient level, and produce light. The light changes the characteristics of the semiconductor and results in a lesser transmission along the transmission line including strip conductor 212, ground conductor 214, and semiconductor 216.

Figure 5B:
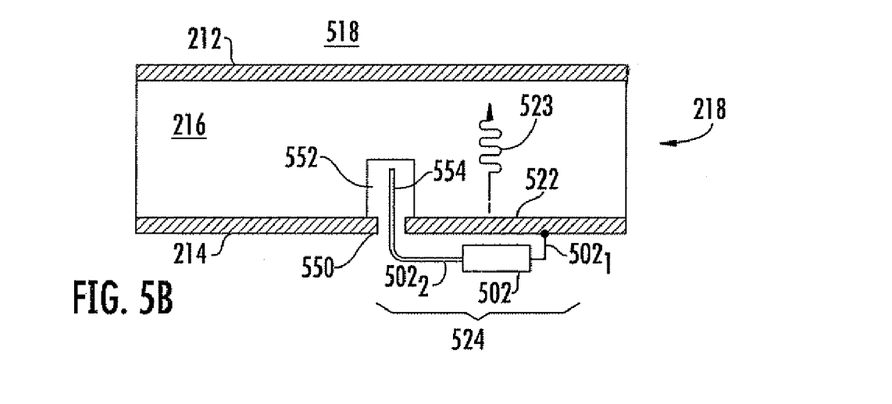
FIG. 5B illustrates the light sources coupled by electric fields to receive the incident electromagnetic energy.

FIG. 5B illustrates a similar arrangement for accomplishing the function of FIG. 5A. In FIG. 5B, the transmission line 518 includes a light-passing aperture or window 522 in ground conductor 214, and one of the light-emitting diodes, namely diode 502, lies adjacent the window, so that its emitted light can pass through the window into the semiconductor 216. Ground plane 214 includes a further aperture 550. A cavity or depression 552 is defined in the semiconductor 216 adjacent aperture 550. A first conductive lead $502_1$ of diode 502 is connected to ground conductor 214. A second conductive lead $502_2$ extends through aperture 550 and defines an electric probe 554 extending into the field region. In operation of the arrangement of FIG. 5B, a portion of the electric field propagating on the transmission line is coupled by way of the electric probe 550 and lead $502_2$ through the light-emitting or photodiode 502. The energy applied to light-emitting or photodiode 502 causes emission of photons of light, illustrated as 522. The photons generate excess charge carriers, which may be viewed as acting as a plasma, providing a path for conduction between the strip conductor of the transmission line and ground.

If the applied electromagnetic energy arrives from the left in the arrangement of FIG. 5B (propagates to the right), the energy is not attenuated by the plasma region before it reaches probe 554, so the structure is an "open-loop" controller. On the other hand, if the electromagnetic energy arrives from the right (propagates to the left), the plasma region near the photons 522 attenuates the electromagnetic energy before it reaches the probe 554, and the control is "closed loop." This slight difference in operation also applies to the limiter stages of FIGS. 2B, 4, and 5A.

Figure 6:
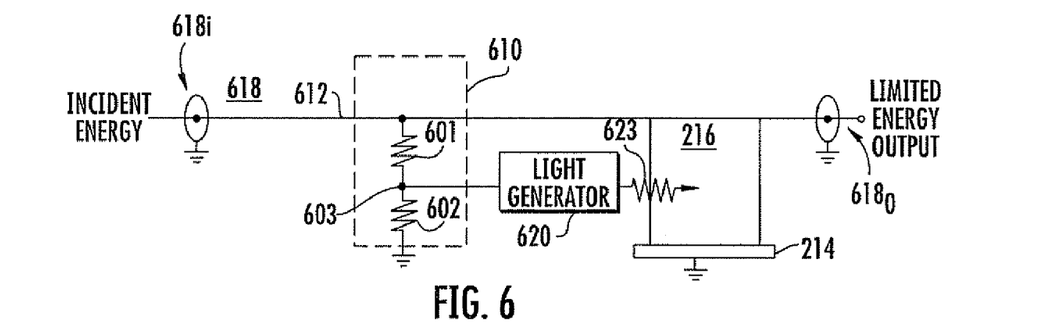
FIG. 6 is a simplified representation of a coaxial transmission line with limiting function in which an attenuator couples the incident electromagnetic energy to the light generator.

As so far described, the electromagnetic energy flowing in the transmission line with the limiting function has been sufficient to provide the energization of the light generator. In some cases, the amplitude of the electromagnetic energy incident on the transmission line with a limiting function may be sufficient to damage the light generator. In this case, it may be necessary to decouple the light generator from the full amplitude of the incident electromagnetic energy, as for example by a directional coupler such as that illustrated in FIG. 3. As an alternative to a directional coupler, a transformer could be used to step down the voltage of the incident electromagnetic energy. As a further alternative, a voltage divider, as for example a resistive voltage divider, could be used. FIG. 6 is a simplified schematic diagram of a coaxial transmission line (coax) 618 including a center conductor 612. The outer conductor is not illustrated, but is represented by the circle with ground symbol. Electromagnetic energy is incident from the left, and propagates to the right, first reaching an attenuator illustrated as a block 610. The center conductor continues to a region 216, where a semiconductor element or material is connected. As illustrated, attenuator 610 includes a resistive voltage divider including resistors 601 and 602 with a tap point 603 therebetween. As known to those skilled in the art, the voltage at the tap point 603, and the energy available, are less at the tap point than in the absence of attenuator 610. A light generator 620 is connected to tap point 603, and generates light illustrated by photon symbol 623. The light is incident on semiconductor material 216, which acts as described above to attenuate the electromagnetic energy flowing along the coax 618. Those skilled in the art know that a voltage divider may utilize but a single impedance element, so long as the "load" applied to the voltage divider has a suitable impedance.

Figure 7:
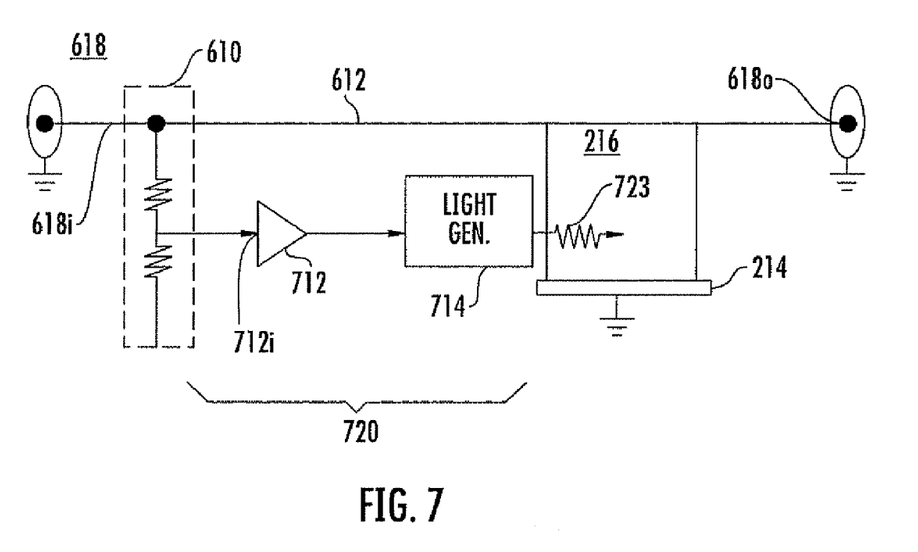
FIG. 7 is a simplified representation of a coaxial transmission line with limiting function in which amplified incident electromagnetic energy is applied to the light generator.

In some cases, the incident electromagnetic energy may be insufficient in amplitude to directly energize the light generator. In such an arrangement, it may be desirable to provide amplification of the electromagnetic energy before it is applied to the light generator. FIG. 7 is a simplified schematic diagram of an arrangement including a coaxial transmission line 618 corresponding to that of FIG. 6. An attenuator or voltage divider 610 may be used, if desired. An amplifier illustrated as 712 has its input port 712*i* connected, possibly by way of attenuator 610, to the center conductor 612 of coax 618. Amplifier 712 amplifies the electromagnetic energy (or sample thereof) which it receives, and applies the amplified energy to a light generator illustrated as a block 714. The light generator of block 714 may be a rectifier/light source combination, such as that of FIG. 2B, 2C, 3, or 4, or it may include a direct energy-to-light converter, such as the ones of FIG. 5A or 5B. In either case, light generator 714 produces photons 723, which are applied to the semiconductor material 216 to thereby generate a "plasma" and attenuate the electromagnetic energy flowing on transmission line 618. The combination of coupler 610, amplifier 712, and light generator 714 may be viewed as an electromagnetically-responsive light source 720 which is coupled to the semiconductor 216.

Figure 8:
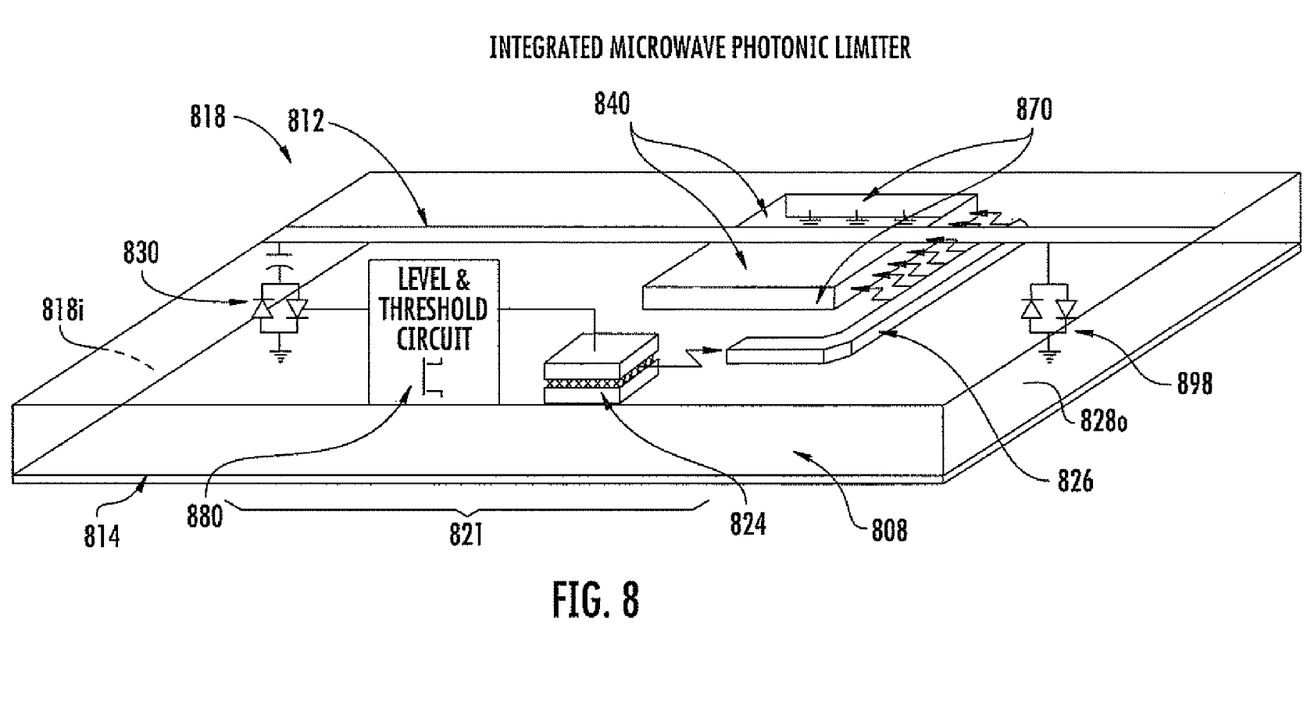
FIG. 8 is a notional perspective or isometric view of an integrated photonic limiter according to an aspect of the invention.

FIG. 8 illustrates an integrated photonic limiter for electromagnetic energy in any frequency range, and particularly for those frequency ranges known as "microwave" and "millimeter-wave." In FIG. 8, a semiconductor substrate 808 has a strip transmission path 812 on its upper surface and a ground conductor 814 on its lower surface. Strip conductor 812 extends from an electromagnetic energy input port 818*i* and "across" a photonic semiconductor attenuation or switch structure 840, and ends at an output port 818*o*. An integrated medium power limiter and sensor structure 830, which is similar to that described in conjunction with FIG. 2C, is coupled "between" the strip conductor 812 and ground 814. The power limiter and sensor 830 produces rectified energy which is applied to an integrated level & threshold & driver circuit 880. Level, threshold & driver circuit 880 may be a Schmitt trigger, as well known in the art. The leveled and/or thresholded sensed electromagnetic energy at the output of circuit 880 drives an integrated light source illustrated as 824. Light source 824 couples its light into an integrated optical waveguide and lens arrangement illustrated as 826. Various ports of optical waveguide and lens arrangement 826 couple light into the photonic semiconductor switch structure 840, which as described above changes impedance in response to the amount of light incident thereon, and attenuates the electromagnetic energy traversing the integrated microwave/mm wave photonic semiconductor switch structure. It should be noted that application of sufficient light to the structure 840 results in attenuation sufficient for the attenuator to be regarded as a switch.

Also in FIG. 8, a leakage or catch limiter illustrated as 898 may be coupled to strip conductor 812 and ground 814 for changing impedance in response to sufficient electromagnetic energy leaking or passing through the switch structure 840. As illustrated, the antiparallel-connected diodes or rectifiers of catch limiter 890 are directly connected to the strip conductor 812 and to ground 814. As an alternative, they may be coupled through a capacitor, similar to circuitry in FIG. 2C.

A transmission line (18; 218; 418; 618; 818) according to an aspect of the invention is for coupling electromagnetic energy from an input port (18*i*, 312*i*; 618*i*; 818*i*) of the transmission line (18; 218; 418; 618; 818) to an output port (18*o*; 618*o*; 818*o*). The output port (18*o*; 618*o*; 818*o*) may be coupled to a receiver (16) or other electrical (electromagnetic) amplitude-sensitive circuit. The transmission line (18; 218; 418; 618; 818) comprises a light generator (20; 220; 420; 520; 720; 821) coupled to the input port (18*i*, 312*i*; 618*i*; 818*i*) and responsive to the electromagnetic energy for generating light. The transmission line (18; 218; 418; 618; 818) also includes semiconductor material (216; 840) located within a region of the transmission line (18; 218; 418; 618; 818) in which electric fields (illustrated as 293) are generated by the flow of electromagnetic energy from the input port (18*i*, 312*i*; 618*i*; 818*i*) to the output port (18*o*; 618*o*; 818*o*). The conductivity of the semiconductor material (216; 840) is responsive to the light from the light generator (20; 220; 420; 524; 720; 821). In one embodiment of this aspect of the invention, the light generator (20; 220; 420; 524; 720; 821) comprises a diode (238, 240), or a semiconductor light source (224; 424; 502; 824) such as a laser or light-emitting diode 224. The diode may be a light-emitting diode (224) or a rectifier (230; 430; 830) device (238, 240). In a particularly advantageous embodiment, the light generator (20; 220; 420; 524; 720; 821) includes a rectifier (230; 430; 830) coupled to the input port (18*i*, 312*i*; 618*i*; 818*i*) of the transmission line (18; 218; 418; 618; 818) for generating rectified electrical energy in response to applied electromagnetic signals, and an electrically-operated light source (224; 424; 502; 824) such as a laser diode or a light-emitting diode.

According to another aspect of the invention, an apparatus (10) comprises an antenna (14) for receiving electromagnetic energy or power, and a receiver (16) for processing electromagnetic energy or power received by way of the antenna. The receiver (16) is subject to degradation or damage in the presence of excessive amplitude of electromagnetic energy or power. A transmission line (18; 218; 418; 618; 818) includes at least an elongated strip conductor (212; 612; 812) overlying a conductive ground plane (214; 814). The transmission line (18; 218; 418; 618; 818) defines an "input" port (18*i*) coupled to the antenna (14) and an "output" port (18*o*) coupled to the receiver (16), for communicating the electromagnetic energy or power from the antenna (14) to the receiver (16). The transmission line (18; 218; 418; 618; 818) includes a portion in which a semiconductor material (216; 840) lies between the strip conductor (212; 612; 812) and the ground plane (214; 814). A light generator (20; 220; 420; 520; 720; 821) is coupled to the input port (18*i*, 312*i*; 618*i*; 818*i*) for receiving electromagnetic energy from the antenna (14), and for producing light in response to the electromagnetic energy. The light impinges on at least a portion of the semiconductor (216; 840), for thereby tending to render the portion of the semiconductor conductive in the presence of the excessive electromagnetic energy or power, and thereby tending to reflect a portion of the excessive electromagnetic energy or power. In one version, the light generator (20; 220; 420; 524; 720; 821) includes a rectifier (230; 430; 830) coupled to the input port (18*i*, 312*i*; 618*i*; 818*i*) and a light generator (20; 220; 420; 524; 720; 821) coupled to the rectifier (230; 430; 830). In a further version, the rectifier (230; 430; 830) is coupled to the input port (18*i*, 312*i*; 618*i*; 818*i*) by way of a path (312; 610) having an attenuation of no less than 3 dB.

A method according to another aspect of the invention is for coupling electromagnetic energy from a source (12) of energy to a circuit (16) which is subject to damage in the presence of excessive electromagnetic energy. The method comprises the steps of coupling the electromagnetic energy to the circuit (16) by way of an electric-field guiding transmission line (18; 218; 418; 618; 818) including a semiconductor material (216; 840) at least partially within the field or influence (293) of the transmission line (18; 218; 418; 618; 818). The semiconductor material (216; 840) is illuminated with light, the amplitude of which is responsive to the amplitude of the electromagnetic energy.

What is claimed is:

1. A transmission line for coupling electromagnetic energy from an input port to an output port, which output port may be coupled to a receiver or other amplitude-sensitive circuit, said transmission line comprising:
    a light generator coupled to said input port and responsive to said electromagnetic energy for generating light; and
    semiconductor material located within a region of said transmission line in which electric fields are generated by the flow of electromagnetic energy from said input port to said output port, the conductivity of said semiconductor material being responsive to said light from said light generator.

2. A transmission line according to claim 1, wherein said light generator comprises a diode.

3. A transmission line according to claim 1, wherein said light generator comprises a light-emitting diode.

4. A transmission line according to claim 1, wherein said light generator is lightly coupled to said input port.

5. A transmission line according to claim 1, wherein said light generator comprises:
    rectifying means coupled to said input port for generating electrical energy in response to application of electromagnetic energy to said input port: and
    an electrically operated light generator device coupled to said rectifying means for generating said light.

6. An apparatus comprising:
    an antenna for receiving electromagnetic signals;
    a receiver for processing electromagnetic signals received by said antenna, said receiver being subject to damage in the presence of excessive signal amplitude;
    a transmission line including at least an elongated strip conductor overlying a conductive ground plane, and defining an input port coupled to said antenna and an output port coupled to said receiver, said transmission line including a portion in which a semiconductor material lies between said strip conductor and said ground plane;
    a light generator coupled to said input port for receiving electromagnetic energy from said antenna, and for producing in response to said electromagnetic energy light which impinges on said semiconductor, for thereby tending to render portion of said semiconductor more conductive in the presence of said excessive electromagnetic energy and tending to reflect a portion of said excessive electromagnetic energy.

7. An apparatus according to claim 6, wherein said light generator comprises:
    a rectifier coupled to said input port for generating rectified electrical energy in response to application of said excessive electromagnetic energy to said input port; and
    an electrically operated light source having its electrical terminals connected to said rectifier for energization of said light source by said rectified electrical energy and its light directed toward at least a portion of said semiconductor.

8. An apparatus according to claim 7, wherein said rectifier is coupled to said input port by a path having an attenuation of no less than three decibels.

9. A method for coupling electromagnetic energy from a source of energy to a circuit subject to damage in the presence of excessive electromagnetic energy, said method comprising the steps of:

coupling said energy to said circuit subject to damage by way of an electric-field guiding transmission line including a semiconductor material at least partially within the field of said transmission line; and illuminating said semiconductor material with light responsive to the amplitude of said electromagnetic energy.

\* \* \* \* \*